United States Patent [19]

Takase et al.

[11] Patent Number: 4,906,019
[45] Date of Patent: Mar. 6, 1990

[54] MOTOR VEHICLE COLLISION SENSING DEVICE

[75] Inventors: Akira Takase; Kunihiko Muraoka, both of Tokyo, Japan

[73] Assignee: Fuji Jukogyo Kabushiki Kaisha, Tokyo, Japan

[21] Appl. No.: 331,817

[22] Filed: Mar. 31, 1989

[30] Foreign Application Priority Data

Apr. 7, 1988 [JP] Japan .................. 63-47033[U]

[51] Int. Cl.$^4$ ............................................. B60R 21/00
[52] U.S. Cl. .................................................. 280/735
[58] Field of Search .................. 280/730, 732, 735; 180/268, 271, 274, 282; 307/10.1; 340/436

[56] References Cited

U.S. PATENT DOCUMENTS

| | | | |
|---|---|---|---|
| 3,720,426 | 3/1973 | Johnston et al. | 280/735 |
| 3,780,314 | 12/1973 | Inose et al. | 280/735 |
| 3,819,203 | 6/1974 | Radke et al. | 280/735 |
| 3,848,695 | 11/1974 | Lacaze, Jr. | 280/735 |
| 4,006,954 | 2/1977 | Ikawa et al. | 280/735 |
| 4,087,782 | 5/1978 | Oishi et al. | 280/735 |
| 4,399,887 | 8/1983 | Okada | 280/735 |
| 4,700,973 | 10/1987 | Gademann et al. | 280/735 |
| 4,804,859 | 2/1989 | Swart | 280/735 |

Primary Examiner—Richard A. Bertsch
Attorney, Agent, or Firm—Beveridge, DeGrandi & Weilacher

[57] ABSTRACT

A motor vehicle collision sensing device for an air bag system comprises a fork-shaped support leaf made of a base portion and a pair of leg portions, and a roller mass rotatably supported by a rolled portion of the support leaf. When collision occurs, the roller mass is caused to roll on the support leaf because of the inertia, and an electric contact on the support leaf is brought into contact with a stationary electric contact disposed between the leg portions of the support leaf, whereby a collision sensing circuit is closed to energize a squib unit so that a safety air bag is instantaneously inflated. A breakdown detecting circuit is provided to detect breakdown of any part of the support leaf. The detecting circuit comprises first and second electric resistors connected to the leg portions, respectively, in parallel with each other. When any one of the leg portions and/or base portion is broken, combined resistance of the resistors is subject to variations, so that by monitoring variations of voltage across the breakdown detecting circuit, breakdown of the collision sensing device is monitored whatever the position of the breakdown of the support leaf is.

2 Claims, 5 Drawing Sheets

MOTOR VEHICLE COLLISION SENSING DEVICE

BACKGROUND OF THE INVENTION

The present invention relates to a motor vehicle collision sensing device and, more particularly, to a motor vehicle collision sensing device used in a safety system of the type which inflates one or more air bags in case of a collision.

Recently, there has been developed an air bag system for protecting a driver and passengers in case of a collision of motor vehicles. Such an air bag system has a collision sensing device which generates a collision signal when a collision occurs. When the collision signal is generated, an explosive is ignited so as to instantaneously inflate an air bag, thereby preventing a driver and passengers from being thrown forward. In such a system, one of the most important component parts is the collision sensor which actuates an explosive ignition circuit exactly at the time of a collision.

Various types of the collision sensors have been developed, and among them, a Rollamite type which comprises a rollspring and a roller is most typical. In this type of the collision sensor, a roller mass is rotatably supported by a fork-shaped support leaf and is normally held in abutment with a retaining member at one end of the support leaf. When collision occurs, the roller mass rolls over the surface of the support leaf and an electric contact attached to the outer surface of the cylindrically rolled portion of the support leaf is brought into contact with a stationary electric contact disposed between two legs of the support leaf, so that an ignition circuit for an explosive, such as a squib, is turned on via the closed contacts.

The free ends of the two legs of the fork-shaped support leaf are securely joined to a common connecting member which in turn is connected to a single resistor to form a breakdown detecting circuit or a diagnosis circuit.

The Rollamite type collision sensing device of the type described above does not accomplish its function properly if it is damaged. In order to eliminate this problem and to improve its reliability in operation, the diagnosis circuit mentioned above is provided which is capable of electrically warning of the damage of the collision sensor. The collision sensor of the type described above is, for example, disclosed in Japanese Laid-Open Patent Publication (KOKAI) No. 54-47244 published Apr. 13, 1979.

In the collision sensor of the type described above, the resistance of the diagnosis circuit becomes infinitely large if the (non-bifurcated) base portion and/or both the bifurcated leg portions of the fork-shaped support leaf are broken, whereby the breakdown of the collision sensor can be detected. However, if only one of the two leg portions of the support leaf is broken, electric current can flow through one of the leg portions of the support leaf so that the breakdown detecting circuit cannot perform its function. Thus, there arises the problem that breakdown or damage of the collision sensor is not perfectly detected.

SUMMARY OF THE INVENTION

An object of the present invention is to provide a motor vehicle collision sensing device of which breakdown detection circuit can detect any damages of itself regardless of the position of damage thereof.

For the above and other objects, the present invention provides a motor vehicle collision sensing device for actuating a collision safety system, which comprises: an electrically conductive fork-shaped support leaf having a base portion and a pair of leg portions; a stationary electric contact provided between the leg portions; a roller mass rotatably supported by said support leaf, the support leaf having thereon a movable electric contact adapted to contact with said stationary contact; first means for electrically connecting said base portion with said collision safety system; second means for electrically connecting said stationary electric contact with the collision safety system, said first and second means forming a collision sensing circuit; first electric resistor means connected between one of said leg portions and said system; second electric resistor means connected between the other leg portion and said system; said first and second electric resistor means being in parallel with each other; and means for monitoring variations i resistance across the first and second electric resistor means to detect breakdown of the collision sensing device.

When breakdown occurs at any position of the support leaf, the voltage across the resistor connected to one leg portion of the support leaf becomes different from the voltage across the resistor connected to the other leg portion. In response to the difference in voltage across the parallelly-connected resistors, breakdown detecting means is actuated, thereby energizing warning means such as a warning lamp or the like.

The other objects and features of the present invention will become understood from the following description with reference to the accompanying drawings.

DETAILED DESCRIPTION OF THE PREFERRED EMBODIMENT

Before describing an embodiment of the present invention, a conventional motor vehicle collision sensing device and the accompanying problem will be explained hereinafter.

Figure 6:
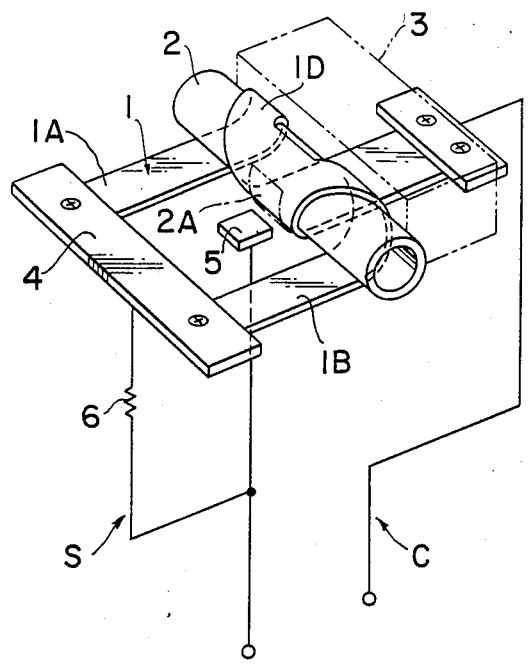
FIG. 6 is a perspective view illustrating a conventional collision sensor device.

As shown in FIG. 6, a conventional collision sensing device of the Rollamite type has a fork-shaped resilient support leaf 1 rotatably supporting by its rolled portion 1D a roller mass 2 which is normally retained in abutment with a retaining member 3 due to the resiliency of the leaf 1. A connecting member 4 joins the ends of two leg portions 1A and 1B of the support leaf 1. A stationary electric contact 5 is provided between the leg portions 1A and 1B, while an electric contact 2A is provided on the rolled portion 1D of the support leaf 2. When collision occurs, the roller mass 2 is caused to roll away from the retaining member 3, and the contact 2A is brought into contact with the stationary contact 5, whereby a collision sensing circuit C is closed to detect the collision. A breakdown detecting circuit or diagnosis circuit including a resistor 6 is connected to the connecting member 4 for detecting damage of the support leaf.

Figure 7A:
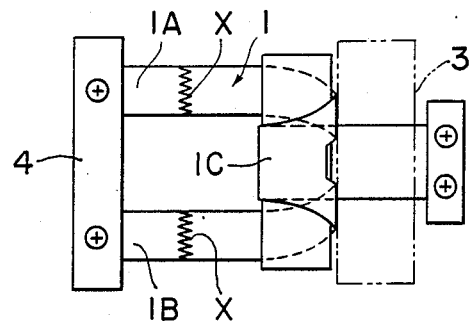
FIGS. 7A, 7B and 7C are views illustrating one or more breakdown positions of a collision sensor device.
Figure 7B:
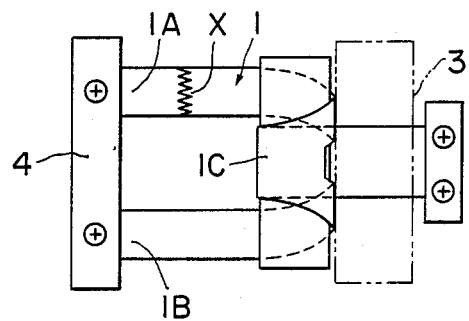
Figure 7C:
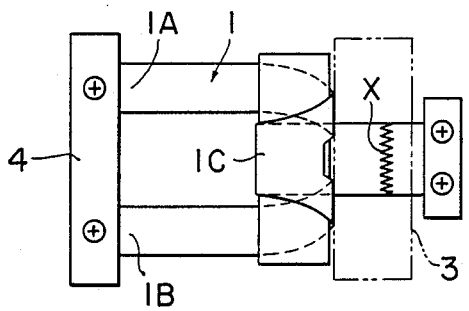

If both the leg portions 1A and 1B are broken at positions indicated at X in FIG. 7A and/or if the base portion of the support leaf 1 is broken at a position indicated at X in FIG. 7C, the electric resistance of the diagnosis circuit will become infinitely large whereby the damage of the support leaf is detected. However, if only one leg portion 1A or 1B is broken as designated at X in FIG. 7B, electric current flows in the circuit so that the damage of the support leaf is not detected.

The problem stated above is eliminated with a collision sensing device of the present invention as described below with reference to FIGS. 1 to 5.

Figure 2:
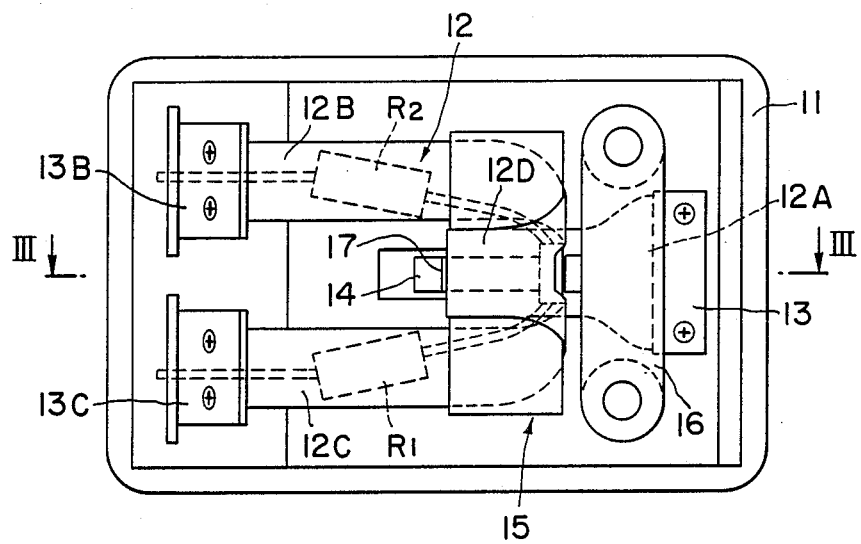
FIG. 2 is a top view of a collision sensor device in accordance with the present invention.
Figure 3:
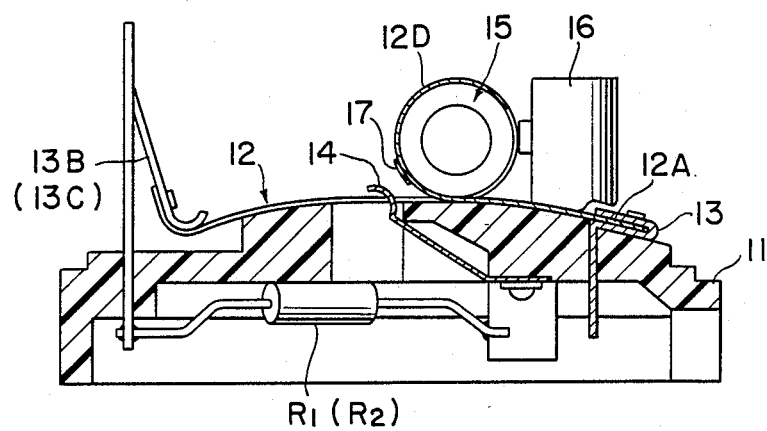
FIG. 3 is a sectional view taken along the line III—III of FIG. 2.
Figure 4:
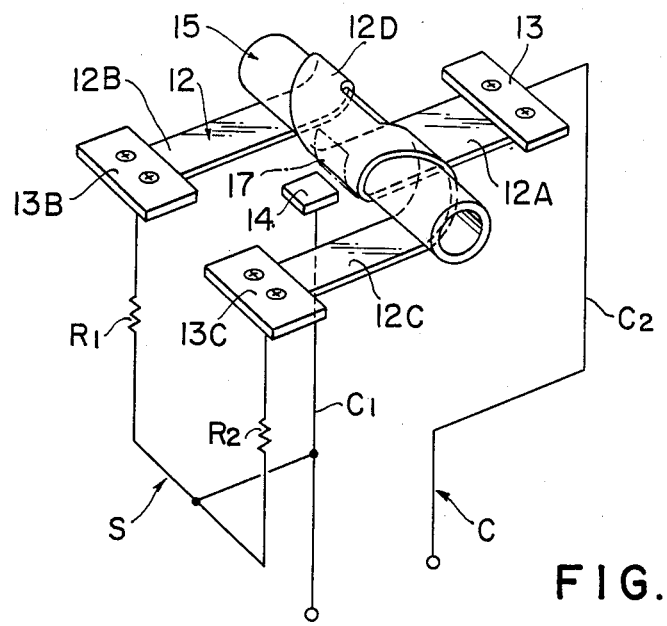
FIG. 4 is a schematic perspective view thereof.

Reference numeral 11 in FIGS. 2 and 3 represents a base upon which is mounted an electrically conductive support leaf 12 having an upwardly convex surface, the leaf 12 being made of a leaf spring, for example, and having a rolled portion 12D. The support leaf 12 has a bifurcated shape comprising a base portion 12A and a pair of leg portions 12B and 12C. The base portion 12A is connected to an electric terminal 13 while the ends of the bifurcated leg portions 12B and 12C are secured by spring retainers 13B and 13C, respectively. As shown in FIG. 4, the spring retainers 13B and 13C are connected to resistors $R_1$ and $R_2$, respectively, in parallel with each other, to form a breakdown detecting circuit S, which is connected to a collision sensing circuit line $C_1$ connected to a stationary contact 14 disposed at a midpoint between the leg portions 12B and 12C.

A roller mass 15 is rotatably supported by the portion 12D of the support leaf 12 and is normally biased toward the terminal 13 because of the elasticity and the convexity of the curved surface of the support leaf 12, so that the roller mass 15 is normally in abutment with a retaining member 16 (FIGS. 2 and 3) extended upwardly from the base portion 11 and is normally retained stationary. The portion 12D of the support leaf has an electric contact 17 attached to the cylindrical outer surface thereof. The support leaf 12 is connected to the terminal 13. The line $C_1$ connected to the contact 14 and another line $C_2$ connected to the terminal 13 constitutes a collision sensing circuit C.

Figure 1:
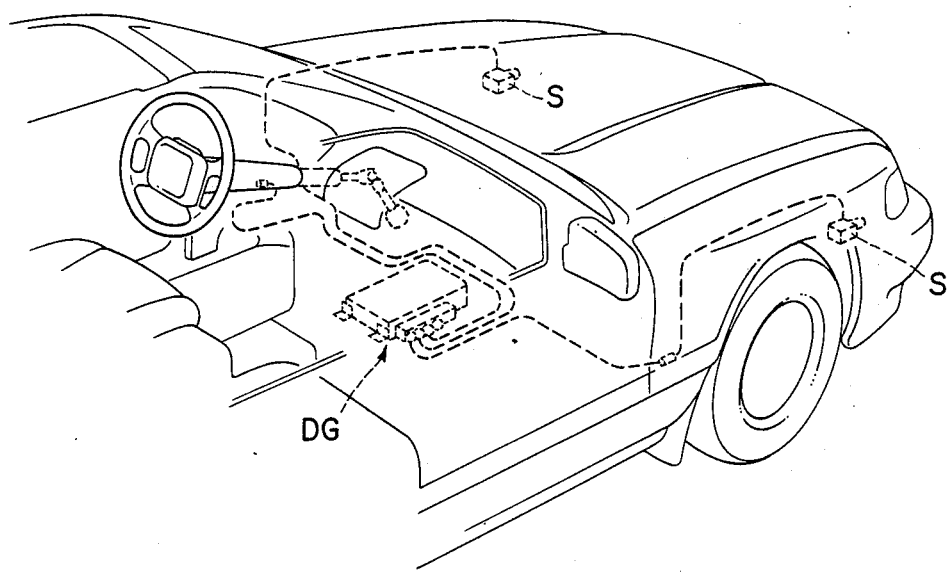
FIG. 1 is a fragmentary view of a motor vehicle, illustrating an arrangement of collision sensor devices and a breakdown diagnosis unit.
Figure 5:
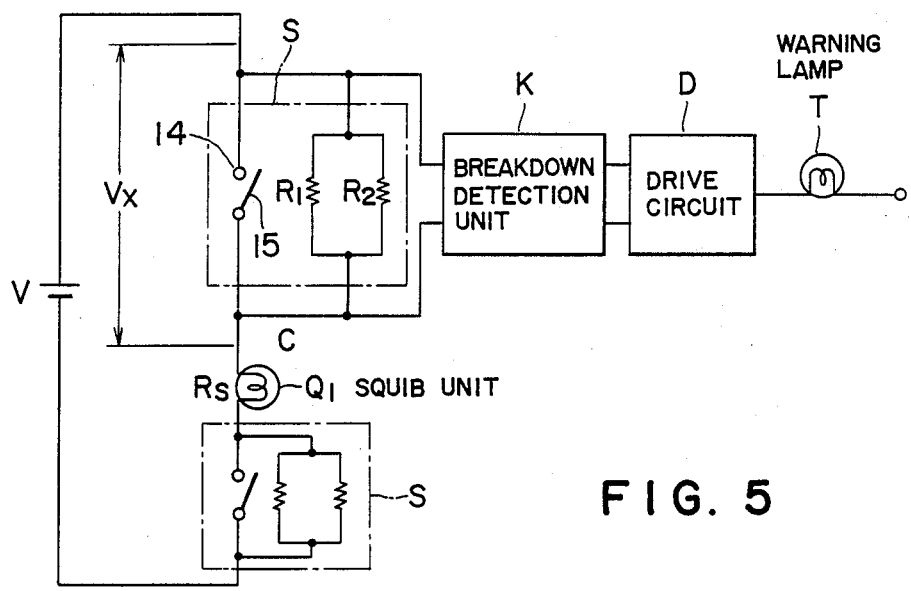
FIG. 5 is a diagram of a circuit thereof.

As shown in FIG. 5, the breakdown detecting circuit S is electrically connected to a squib unit $Q_1$ (having an electric resistance Rs) as well as to a power supply V mounted on the vehicle. A breakdown detection unit K is connected in parallel with the detecting circuit S. And in response to the output from the breakdown detection unit K, a drive circuit D is energized to turn on a warning lamp T. Another detection circuit S identical to the circuit S described above is provided as shown in FIG. 5. As illustrated in FIG. 1, a pair of the collision sensing devices having the detection circuit S is provided at the front side of the vehicle. In FIG. 1, DG indicates a diagnosis unit.

Let it be assumed that the voltage across the detecting circuit S is Vx and that of the power supply is V. Further, it is assumed that $R_1$ and $R_2$ are equal and have a value of R equal to 1 k$\Omega$ and that Rs is equal to 2$\Omega$. Under such conditions, there can be considered the following three states (i), (ii) and (iii) in which three different values of Vx are obtained, respectively.

(i) Normal state:

$$Vx = \frac{\frac{R_1 \cdot R_2}{R_1 + R_2}}{\frac{R_1 \cdot R_2}{R_1 + R_2} + Rs + \frac{R_1 \cdot R_2}{R_1 + R_2}} \cdot$$

$$V = \frac{R \cdot V}{2(R + Rs)} = 6 \, (V)$$

(ii) When one of the leg portions of the support leaf is broken:

$$Vx = \frac{R}{R + Rs + \frac{R_1 \cdot R_2}{R_1 + R_2}} \cdot V = \frac{R \cdot V}{\frac{3}{2} R + Rs} = 8 \, (V)$$

(iii) Both of the leg portions of the support leaf are broken:

$$Vx = V \, (= 12 \, V)$$

That is, in the normal state the combined resistance is R/2; in case of the breakdown of one leg portion, the resistance is R; and in case of the breakdown of both the leg portions, the resistance become infinitely large. These variations in resistance is detected to light the warning lamp, thereby warning the driver of the breakdown of the collision sensing device.

As described above, in the vehicle collision sensor device in accordance with the present invention, the resistors are connected in parallel with each other to the leg portions of the support leaf, so that breakdown of the support leaf can be detected by monitoring variations of the voltage across the resistors. It therefore follows that regardless of the position of breakdown of the support leaf, the breakdown can be detected so that reliability of the air bag safety system is increased.

While the presently preferred embodiment of the present invention has been shown and described, it is to be understood that this disclosure is for the purpose of illustration and that various changes and modifications may be made without departing from the scope of the invention as set forth in the appended claims.

What is claimed is:
1. A motor vehicle collision sensing device for actuating a collision safety system comprising:
   an electrically conductive fork-shaped support leaf having a base portion and a pair of leg portions;
   a stationary electric contact provided between the leg portions;
   a roller mass rotatably supported by said support leaf, said support leaf having thereon a movable electric contact adapted to be brought into contact with said stationary contact;
   first means for electrically connecting said base portion with said collision safety system;
   second means for electrically connecting said stationary electric contact with said collision safety system, said first and second electrically connecting means forming a collision sensing circuit;
   first electric resistor means connected to one of said leg portions;
   second electric resistor means connected to the other leg portion; said first and second electric resistor means being in parallel with each other; and
   means for monitoring variations in resistance across the first and second electric resistor means to detect breakdown of the collision sensing device.
2. The motor vehicle collision sensing device according to claim 1, further comprising first and second retainer means firmly securing said first and second leg portions, respectively, said first and second resistor means being electrically connected to the first and second retainer means, respectively.

* * * * *